(12) United States Patent
Chiang

(10) Patent No.: US 11,861,213 B2
(45) Date of Patent: Jan. 2, 2024

(54) TIME-DIVISION MEMORY CONTROL DEVICE

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 30 days.

(21) Appl. No.: 17/828,069

(22) Filed: May 31, 2022

(65) Prior Publication Data
US 2023/0137338 A1 May 4, 2023

(30) Foreign Application Priority Data

Nov. 2, 2021 (TW) ................................. 110140800

(51) Int. Cl.
*G06F 3/06* (2006.01)
(52) U.S. Cl.
CPC .......... *G06F 3/0655* (2013.01); *G06F 3/0604* (2013.01); *G06F 3/0673* (2013.01)
(58) Field of Classification Search
None
See application file for complete search history.

(56) References Cited

U.S. PATENT DOCUMENTS

| 2006/0256601 | A1* | 11/2006 | Ma ...................... G11C 11/5642 |
| | | | 365/49.11 |
| 2017/0153835 | A1 | 6/2017 | Miki |
| 2017/0270323 | A1* | 9/2017 | Butler .............. G06K 19/07749 |
| 2018/0374538 | A1 | 12/2018 | Hayashi |

OTHER PUBLICATIONS

OA letter of a counterpart TW application (U.S. Appl. No. 110140800) mailed on 2022/06/29.2) Summary of the TW OA letter in regard to the TW counterpart application.

* cited by examiner

*Primary Examiner* — Brian R Peugh
(74) *Attorney, Agent, or Firm* — WPAT, P.C

(57) ABSTRACT

A time-division memory control device controls a content addressable memory (CAM) cell array of a CAM in a time-division manner and thereby reduces a peak current and mitigates electromigration and voltage variation problems. The time-division memory control device includes a time-division controller and a peripheral circuit. In a search and compare operation, the time-division controller outputs a first group of control signals at a first time point according to a system clock, and outputs a second group of control signals at a second time point later than the first time point. The peripheral circuit includes: a first group of circuits cooperating with a first group of CAM cells of the CAM cell array according to the first group of control signals; and a second group of circuits cooperating with a second group of CAM cells of the CAM cell array according to the second group of control signals.

20 Claims, 12 Drawing Sheets

TIME-DIVISION MEMORY CONTROL DEVICE

BACKGROUND OF THE INVENTION

1. Field of the Invention

The present disclosure relates to a memory control device, especially to a time-division memory control device.

2. Description of Related Art

FIG. 1 shows a basic cell 100 of a conventional content addressable memory (CAM). The basic cell 100 includes a storage component 110 and a comparison component 120. The storage component 110 is configured to store storage data, and the comparison component 120 is configured to compare the storage data with input data and thereby output a comparison result to a match line (ML) that can be accessed by a back-end circuit. The storage data is stored through the control of a word line (WL) and a bit line (BL). The input data is provided through the control of a search bit line (SBL). As shown in FIG. 1, the bit line includes a positive-end bit line (BLP) and a negative-end bit line (BLN), and the search bit line includes a positive-end search bit line (SBLP) and a negative-end search bit line (SBLN).

FIG. 2 shows a basic configuration 200 of a conventional CAM array. The basic configuration 200 includes a CAM cell array 210, a read/write auxiliary circuit (e.g., search data register and search-bit-line driver) 220, a pre-charge circuit 230, and an output circuit 240. Each row/column of the CAM cell array 210 includes multiple CAM cells. An example of each CAM cell (TC) is the basic cell 100 of FIG. 1. The read/write auxiliary circuit 220 includes multiple drivers. Each driver (DRV) is configured to control the search bit line of a column of CAM cells and thereby provide input data. The pre-charge circuit 230 includes multiple charging units. Each charging unit (PR) is configured to charge or discharge the match line of a row of CAM cells according to a pre-charge signal (not shown in the figure). The output circuit 240 includes multiple match output units. Each match output unit (MO) is configured to output the comparison result of a row of CAM cells.

In regard to FIGS. 1-2, When the basic configuration 200 of the conventional CAM array operates, the pre-charge circuit 230 charges the match line of a CAM cell (hereinafter referred to as "the selected CAM cell") that is selected from the CAM cell array 210, and thereby makes the voltage level of the match line reach a relatively high level (i.e., logical high); and after the read/write auxiliary circuit 220 provides input data, the selected CAM cell compares its storage data with the input data and thereby generates a comparison result. If the comparison result shows that the storage data of the selected CAM cell is different from the input data, the pre-charge circuit 230 discharges the match line of the selected CAM cell to make the voltage level decrease to a relatively low level (logical low). If the comparison result shows that the storage data of the selected CAM cell is the same as the input data, the pre-charge circuit 230 leaves the match line of the selected CAM cell alone to let it stay at the high level.

Reference is made to FIGS. 1-3. FIG. 3 shows an example of the detail of the basic configuration 200 of the conventional CAM array of FIG. 2. In regard to FIGS. 1-3, the comparison components of two adjacent CAM cells in a row of the CAM cell array 210 share one ground line (e.g., the ground trace GND as shown in FIG. 3) and thus fulfill a reduction of layout area. However, if the CAM cell array 210 is made with an advanced process, the above-mentioned sharing will cause an electromigration (EM) or voltage variation (IR) problem when the basic configuration 200 of the conventional CAM array performs a search operation. The EM problem will decrease the service life of a chip, and the IR problem will greatly affect the chip's performance.

FIG. 4 shows an example of the detail of the basic configuration 200 of the conventional CAM array of FIG. 2. In regard to FIGS. 1-4, two adjacent charging units in the pre-charge circuit 230 share one power line (e.g., the power trace VDD as shown in FIG. 4) and thus fulfill a reduction of layout area. However, the above-mentioned sharing will cause a serious EM/IR problem when the basic configuration 200 of the conventional CAM array performs a pre-charge operation.

In regard to FIGS. 1-2, if all match output units in the output circuit 240 are activated simultaneously, a great power consumption will occur, and this will cause a serious EM/IR problem.

SUMMARY OF THE INVENTION

An object of the present disclosure is to provide a time-division memory control device capable of preventing the electromigration (EM)/voltage variation (IR) problem in the prior art.

An embodiment of the time-division memory control device of the present disclosure is configured to control a content addressable memory (CAM). This embodiment includes a time-division controller and multiple peripheral circuits. The time-division controller is configured to generate multiple groups of control signals according to a system clock in a search and compare operation, wherein the multiple groups of control signals include a first group of control signals and a second group of control signals, and the time-division controller outputs the first group of control signals at a first time point and outputs the second group of control signals at a second time point later than the first time point. The multiple peripheral circuits are configured to cooperate with a CAM cell array of the CAM, wherein the multiple peripheral circuits include a first peripheral circuit. The first peripheral circuit includes: a first group of circuits configured to cooperate with a first group of CAM cells of the CAM cell array according to the first group of control signals; and a second group of circuits configured to cooperate with a second group of CAM cells of the CAM cell array according to the second group of control signals, wherein the second group of CAM cells does not include any CAM cell of the first group of CAM cells.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a time-division memory control device. The time-division memory control device can control a content addressable memory (CAM) in a time-division manner and thereby reduce a peak current and mitigate electromigration (EM) and/or voltage variation (IR) problems.

Figure 1:
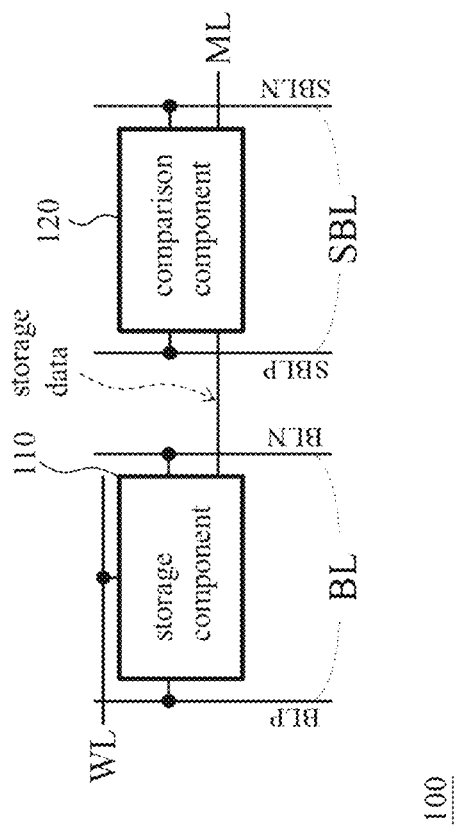
FIG. 1 shows a basic cell of a conventional content addressable memory (CAM).
Figure 2:
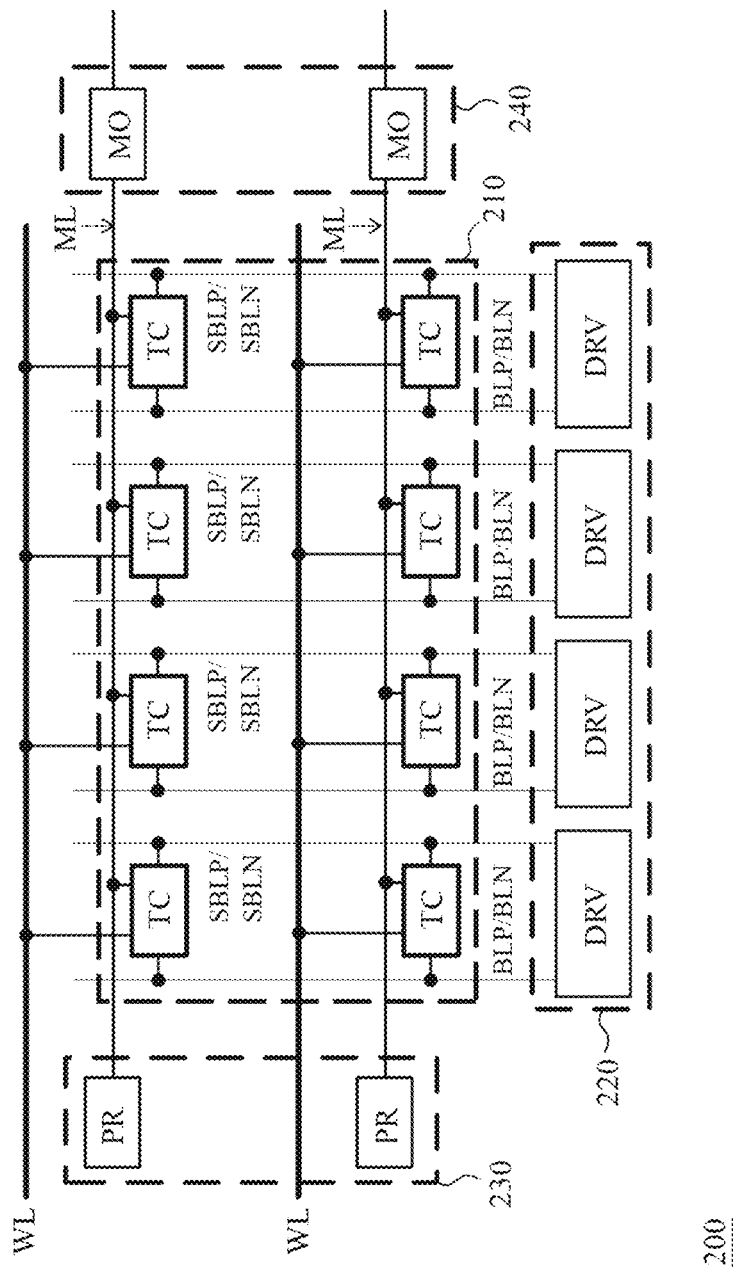
FIG. 2 shows a basic configuration of a conventional CAM array.
Figure 3:
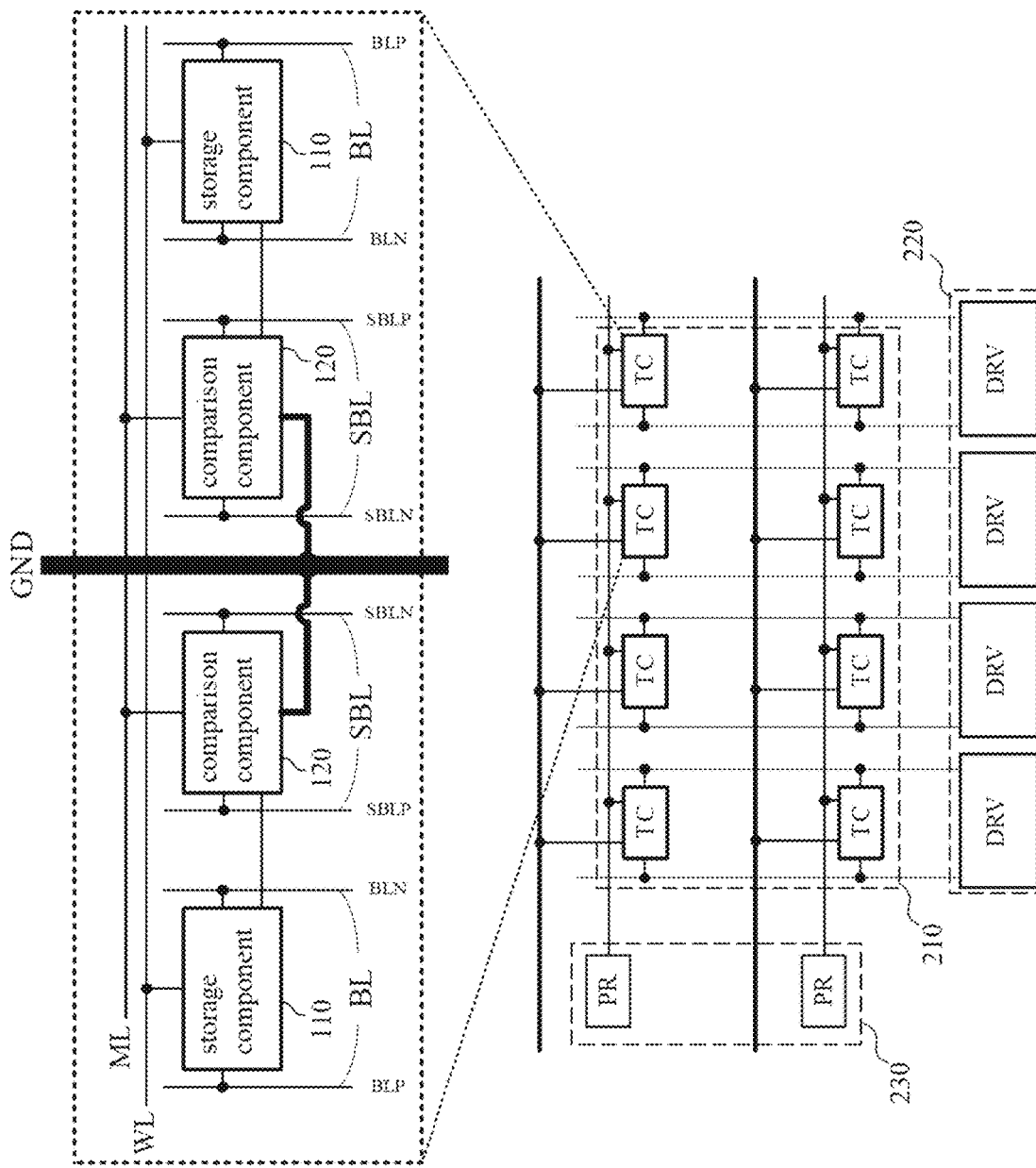
FIG. 3 shows that the comparison components of two adjacent CAM cells share one ground line.
Figure 4:
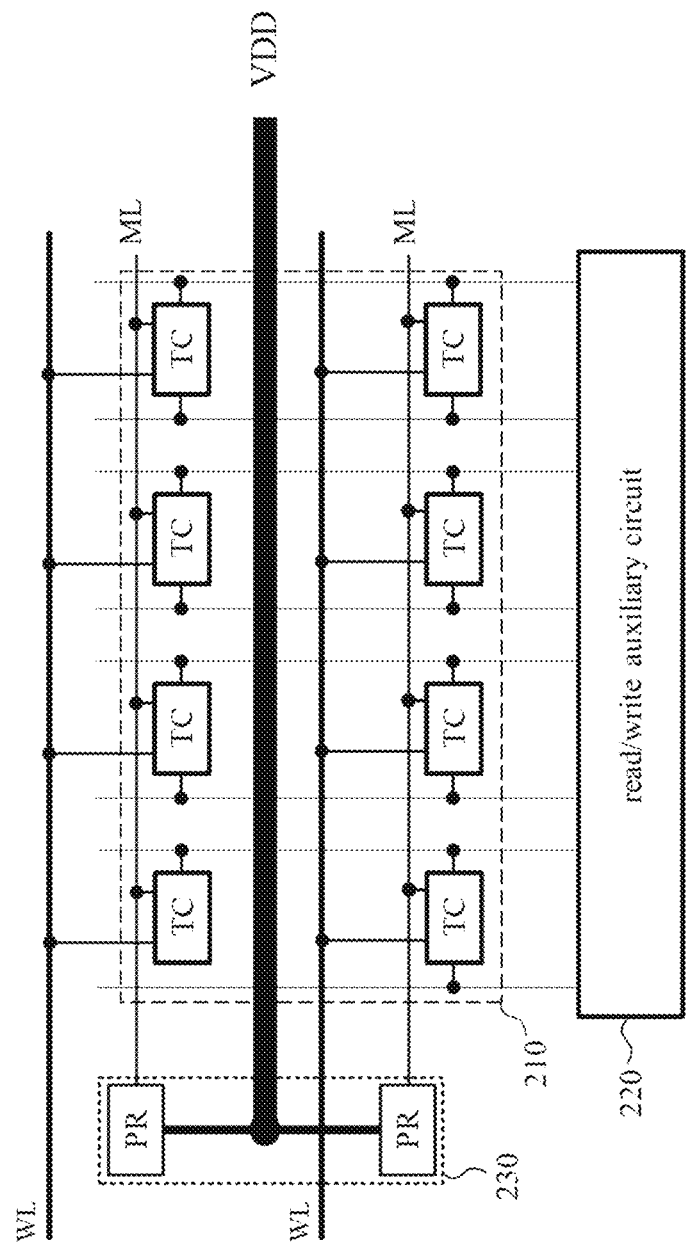
FIG. 4 shows that two adjacent charging units share one power line.
Figure 5:
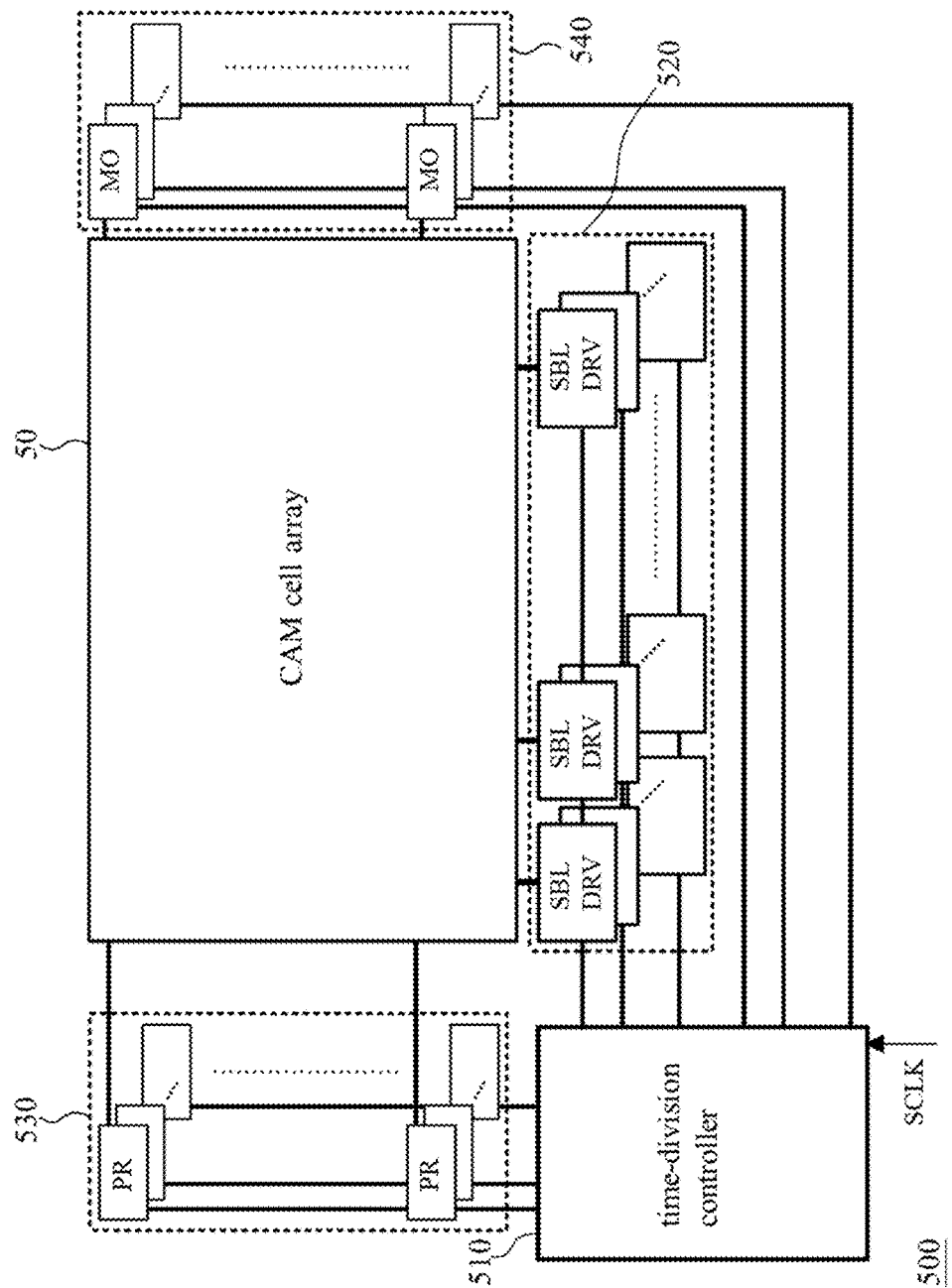
FIG. 5 shows an embodiment of the time-division memory control device of the present disclosure.

FIG. 5 shows an embodiment of the time-division memory control device of the present disclosure. The time-division memory control device 500 of FIG. 5 is configured to control a CAM cell array 50 of a CAM, and includes a time-division controller 510 and multiple peripheral circuits. The CAM cell array 50 can be included in the time-division memory control device 500 or be set outside the time-division memory control device 500. An embodiment of each CAM cell (TC) of the CAM cell array 50 is illustrated with FIG. 1. An embodiment of the multiple peripheral circuits includes a read/write auxiliary circuit 520, a pre-charge circuit 530, and an output circuit 540. An embodiment of the output circuit 540 includes a sense amplifier circuit and/or a register circuit such as a latch circuit. The time-division controller 510 controls at least one peripheral circuit of the multiple peripheral circuits in a time-division manner and thereby makes the at least one peripheral circuit cooperate with the CAM cell array 50 in the time-division manner. It is noted that each of the read/write auxiliary circuit 520, the pre-charge circuit 530, and the output circuit 540 in FIG. 5 is divided into multiple groups of circuits, but the implementation of the present invention is not limited thereto; in other words, the grouping feature of the present invention can be fulfilled by dividing at least one of the read/write auxiliary circuit 520, the pre-charge circuit 530, and the output circuit 540 into multiple groups of circuits.

In regard to the embodiment of FIG. 5, the time-division controller 510 is configured to generate multiple groups of control signals according to a system clock SCLK in a search and compare operation. The multiple groups of control signals include a first group of control signals and a second group of control signals. The time-division controller 510 outputs the first group of control signals at a first time point and outputs the second group of control signals at a second time point, wherein the second time point is later than the first time point on the timeline. In an exemplary implementation of the embodiment of FIG. 5, the time-division controller 510 is configured to control at least one of the read/write auxiliary circuit 520 and the pre-charge circuit 530, and the first time point is synchronous with a trigger time point of the system clock SCLK; for example, the voltage levels of the first group of control signals and the voltage level of the system clock SCLK rise synchronously (as shown in FIG. 9b). In an exemplary implementation of the embodiment of FIG. 5, the time-division controller 510 is configured to control the output circuit 540, and the first time point is later than a trigger time point of the system clock SCLK; for example, the voltage level of the system clock SCLK rises at the trigger time point, the voltage levels of the first group of control signals rise at the first time point, and the first time point is later than the trigger time point by a predetermined time (as shown in FIG. 9c). The predetermined time is determined according to the time for the CAM cell array 50 performing a search and comparison operation.

Figure 6:
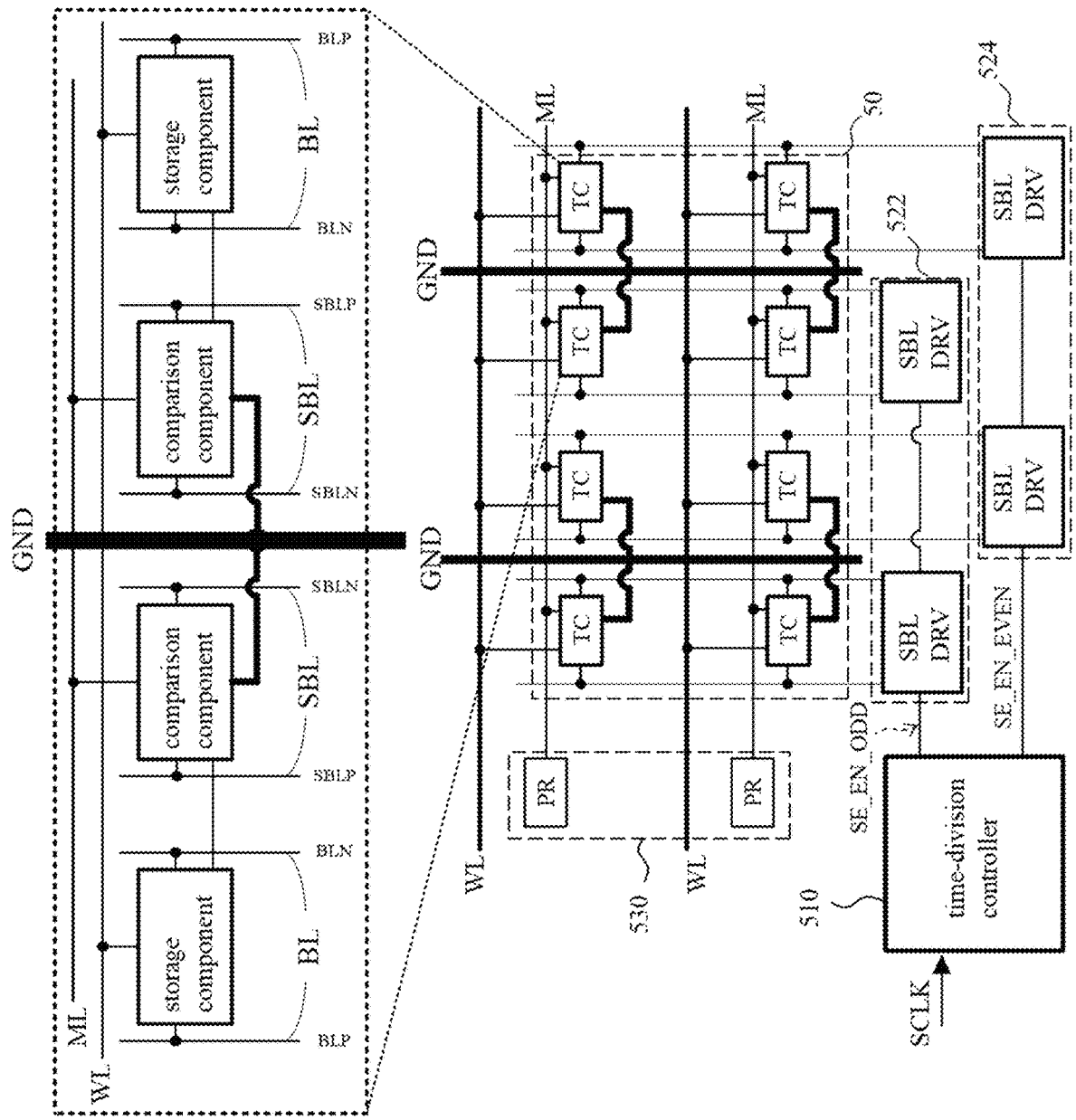
FIG. 6 shows that the time-division controller of FIG. 5 controls the read/write auxiliary circuit in a time-division manner.

FIG. 6 shows that the time-division controller 510 controls the read/write auxiliary circuit 520 in a time-division manner and thereby makes it cooperate with the CAM cell array 50 in the time-division manner. As shown in FIG. 6, the read/write auxiliary circuit 520 includes multiple search-bit-line (SBL) drivers. Each SBL driver (SBL_DRV) is a known/self-developed driver and configured to control the search bit lines of a column of CAM cells of the CAM cell array 50. The multiple SBL drivers are divided into at least two groups of circuits including a first group of circuits 522 (e.g., the circuits in the odd column(s) of the auxiliary circuit 520, these circuits including one or more SBL drivers) and a second group of circuits 524 (e.g., the circuits in the even column(s) of the auxiliary circuit 520, these circuits including one or more SBL drivers). The first group of circuits 522 is configured to cooperate with a first group of CAM cells of the CAM cell array 50 (e.g., the CAM cells in the odd column(s) of the CAM cell array 50) according to the aforementioned first group of control signals SE_EN_ODD. The second group of circuits 524 is configured to cooperate with a second group of CAM cells of the CAM cell array 50 (e.g., the CAM cells in the even column(s) of the CAM cell array 50) according to the aforementioned second group of control signals SE_EN_EVEN. The second group of CAM cells does not include any CAM cell of the first group of CAM cells. In regard to the first group of CAM cells and the second group of CAM cells, although two adjacent CAM cells or two adjacent columns of CAM cells share one ground trace GND, the search and compare operations of the first and second groups of CAM cells are staggered due to the above-mentioned grouping and time-division control, and thus the peak current of each ground trace GND is reduced and the EM/IR problem is mitigated.

Figure 7:
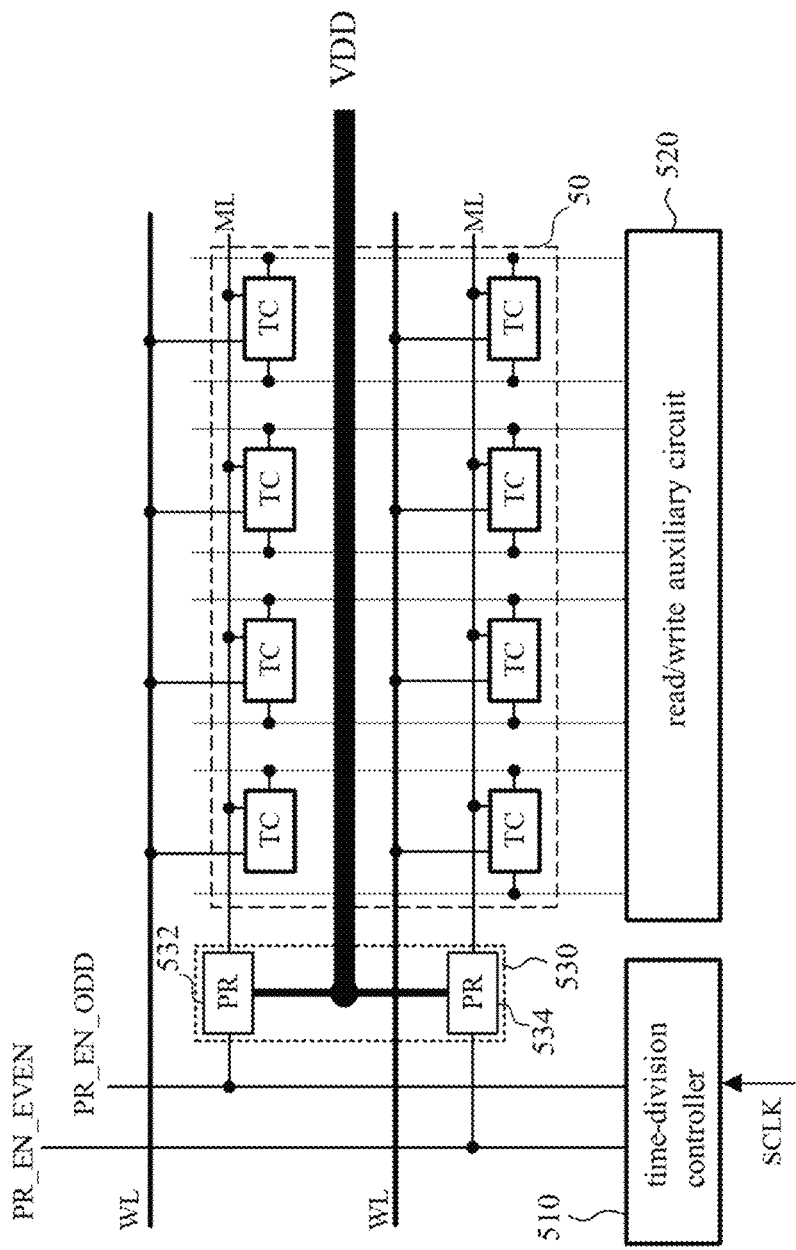
FIG. 7 shows that the time-division controller of FIG. 5 controls the pre-charge circuit in a time-division manner.

FIG. 7 shows that the time-division controller 510 of FIG. 5 controls the pre-charge circuit 530 in a time-division manner and thereby makes it cooperate with the CAM cell array 50 in the time-division manner. As shown in FIG. 7, the pre-charge circuit 530 includes multiple pre-charge units. Each pre-charge unit (PR) is a known/self-developed pre-charge unit and configured to charge or discharge the match line (ML) of one row of CAM cells of the CAM cell array 50. The multiple pre-charge units are divided into at least two groups of circuits including a first group of circuits 532 (e.g., the circuits in the odd row(s) of the pre-charge circuit 530, these circuits including one or more pre-charge units) and a second group of circuits 534 (e.g., the circuits in the even row(s) of the pre-charge circuit 530, these circuits including one or more pre-charge units). The first group of circuits 532 is configured to cooperate with a first group of CAM cells of the CAM cell array 50 (e.g., the CAM cells in the odd row(s) of the CAM cell array 50) according to the aforementioned first group of control signals PR_EN_ODD. The second group of circuits 534 is configured to cooperate with a second group of CAM cells of the CAM cell array 50 (e.g., the CAM cells in the even row(s) of the CAM cell array 50) according to the aforementioned second group of control signals PR_EN_EVEN. The second group of CAM cells does not include any CAM cell of the first group of CAM cells. In regard to the first group of circuits 532 and the second group of circuits 534, although two adjacent pre-charge units share one power trace VDD, the pre-charge operations of the first group of circuits 532 and the second group of circuits 534 are staggered due to the above-mentioned grouping and time-division control, and thus the peak current of each power trace VDD is reduced and the EM/IR problem is mitigated.

Figure 8:
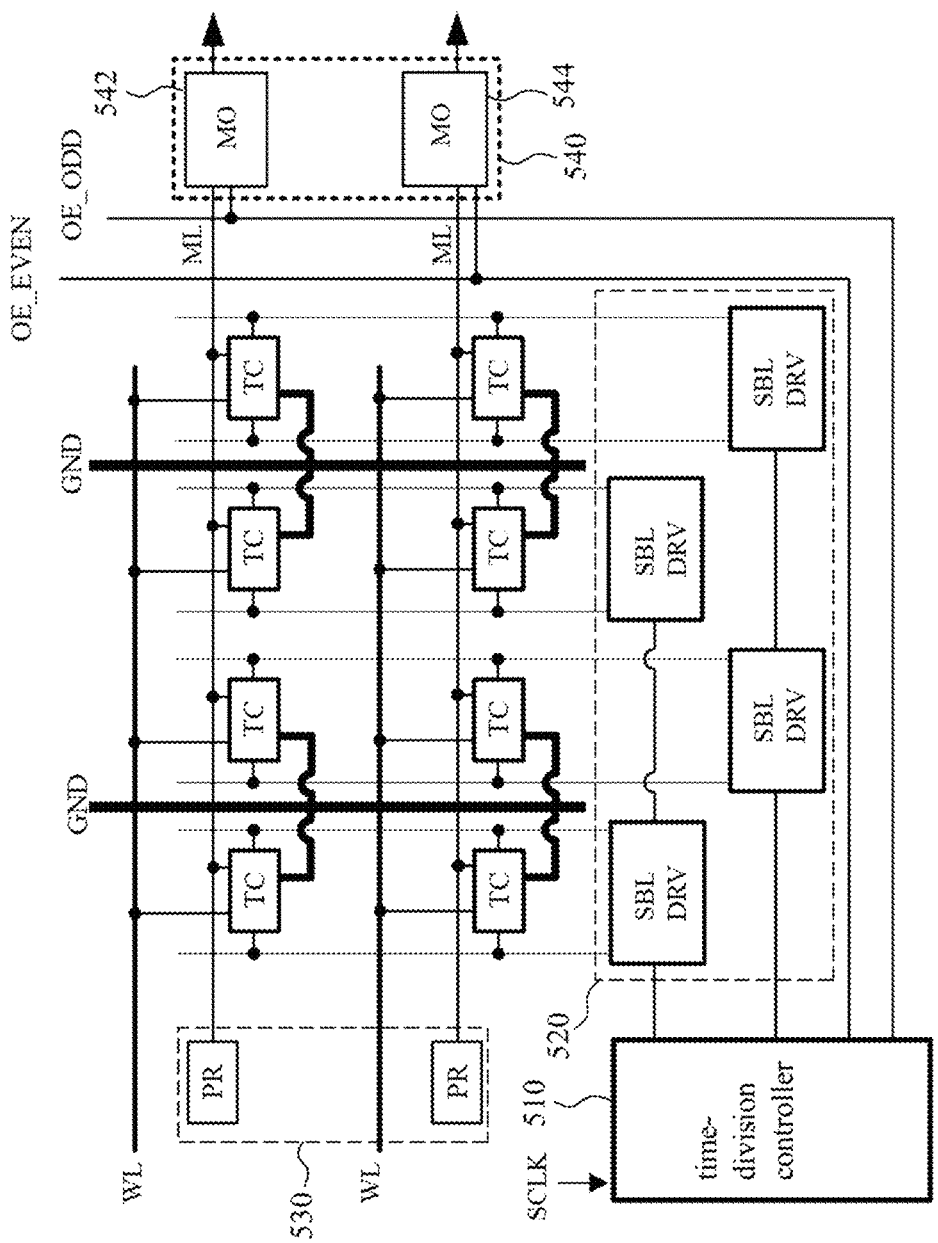
FIG. 8 shows that the time-division controller of FIG. 5 controls the output circuit in a time-division manner.

FIG. 8 shows that the time-division controller 510 of FIG. 5 controls the output circuit 540 in a time-division manner and thereby makes it cooperate with the CAM cell array 50 in the time-division manner. As shown in FIG. 8, the output circuit 540 includes multiple match output units. Each match output unit (MO) is a known/self-developed match output unit (e.g., a sense amplifier and/or a register circuit such as a latch circuit) and configured to output the comparison result of the match line of one row of CAM cells of the CAM cell array 50. The multiple match output units are divided into at least two groups of circuits including a first group of circuits 542 (e.g., the circuits in the odd row(s) of the output circuit 540, these circuits including one or more match output units) and a second group of circuits 544 (e.g., the circuits in the even row(s) of the output circuit 540, these circuits including one or more match output units). The first group of circuits 542 is configured to cooperate with a first group of CAM cells of the CAM cell array 50 (e.g., the CAM cells in the odd row(s) of the CAM cell array 50) according to the aforementioned first group of control signals OE_ODD. The second group of circuits 544 is configured to cooperate with a second group of CAM cells of the CAM cell array 50 (e.g., the CAM cells in the even row(s) of the CAM cell array 50) according to the aforementioned second group of control signals OE_EVEN. The second group of CAM cells does not include any CAM cell of the first group of CAM cells in FIG. 8. In light of the above, the match output operations of the first group of circuits 542 and the second group of circuits 544 are staggered due to the above-mentioned grouping and time-division control, and thus the overall match output units of the output circuit 540 won't be activated simultaneously, the instantaneous maximum power of the output circuit 540 is reduced, and the EM/IR is problem mitigated.

Figure 9A:
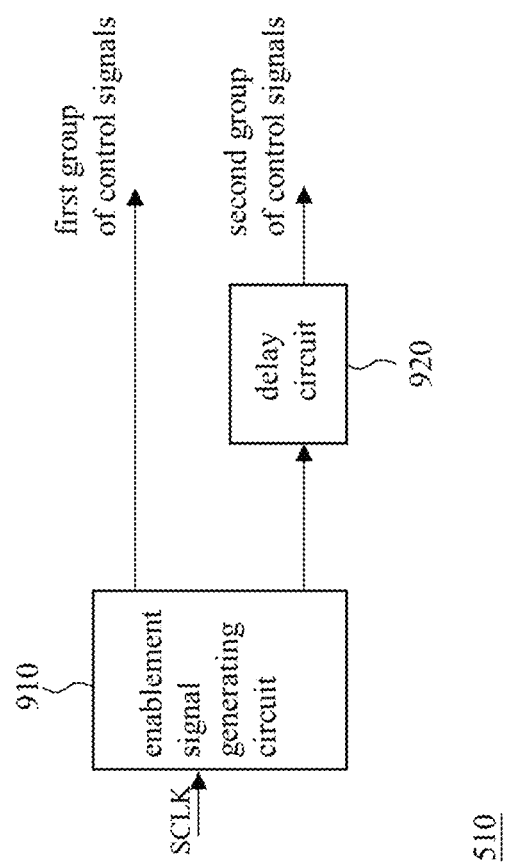
FIG. 9a shows an embodiment of the time-division controller of FIG. 5.
Figure 9B:
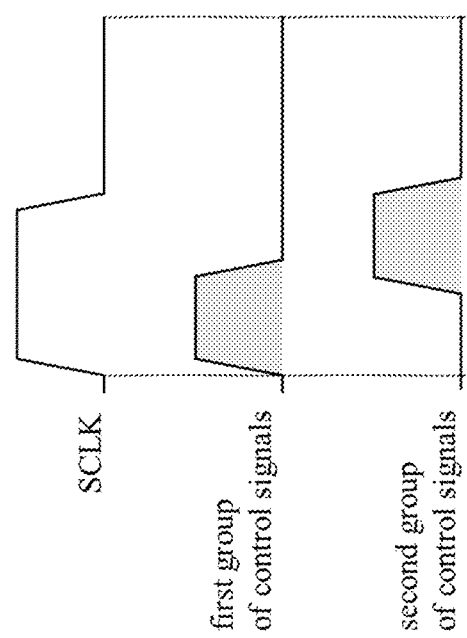
FIG. 9b shows the timing diagram of the signals in FIG. 9a in an application.
Figure 9C:
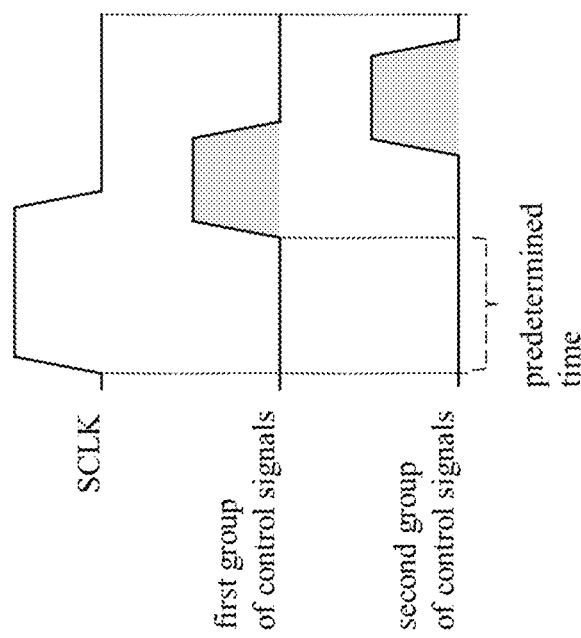
FIG. 9c shows the timing diagram of the signals in FIG. 9a in another application.

FIG. 9a shows an embodiment of the time-division controller 510. As shown in FIG. 9a, the time-division controller 510 includes an enablement signal generating circuit 910 and a delay circuit 920. The enablement signal generating circuit 910 (e.g., a logic circuit implementing a finite state machine (FSM) whose actions are determined according to the demand for implementation) is configured to generate the first group of control signals (i.e., the aforementioned SE_EN_ODD/PR_EN_ODD/OE_ODD) and the second group of control signals (i.e., the aforementioned SE_EN_EVEN/PR_EN_EVEN/OE_EVEN) according to the system clock SCLK in the aforementioned search and compare operation. The first group of control signals and the second group of control signals are used for enabling the aforementioned first group of circuits 522/532/542 and the aforementioned second group of circuits 524/534/544. The delay circuit 920 is configured to delay the second group of control signals and thereby make the time-division controller 510 output the second group of control signals at the second time point later than the first time point. It is noted that the delay amount caused by the delay circuit 920 can be determined according to a circuit simulation result or in a known/self-developed manner.

Please refer to FIGS. 5-9a. On condition that the time-division controller 510 is configured to control at least one of the read/write auxiliary circuit 520 and the pre-charge circuit 530, the first time point is synchronous with a trigger time point of the system clock; for example, FIG. 9b shows the timing diagram of the signals in FIG. 9a under the above-mentioned condition, and the first time point (i.e., the time point when the voltage levels of the first group of control signals rise up) is synchronous with the trigger time point of the system clock SCLK (i.e., the time point when the voltage level of the system clock SCLK rises up). On condition that the time-division controller 510 is configured to control the output circuit 540, the first time point is later than a trigger time point of the system clock SCLK; for example, FIG. 9c shows the timing diagram of the signals in FIG. 9a under the above-mentioned condition, and the first time point (i.e., the time point when the voltage levels of the first group of control signals rise up) is later than the trigger time point of the system clock SCLK (i.e., the time point when the voltage level of the system clock SCLK rises up), wherein the interval between the two time points is predetermined and is not shorter than the time for the aforementioned first group of CAM cells finishing the operation (i.e., the search and compare operation or the pre-charge operation). It is noted that the second time point (i.e., the time point when the voltage levels of the second group of control signals rise up) is later than the first time point in FIGS. 9b-9c.

Figure 10:
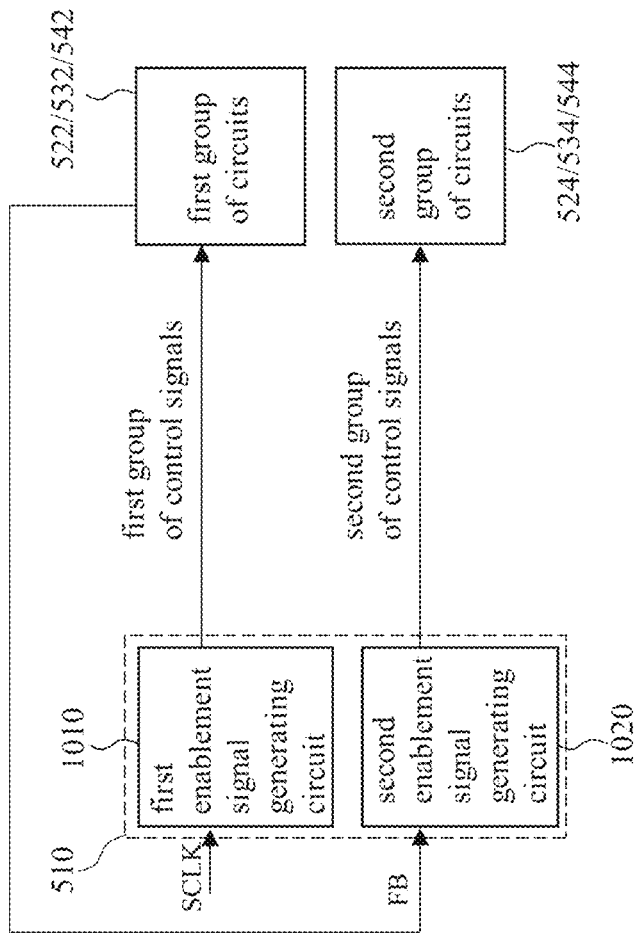
FIG. 10 shows another embodiment of the time-division controller of FIG. 5.

FIG. 10 shows another embodiment of the time-division controller 510. As shown in FIG. 10, the time-division controller 510 includes a first enablement signal generating circuit 1010 and a second enablement signal generating circuit 1020. The first enablement signal generating circuit 1010 (e.g., a logic circuit implementing a finite state machine (FSM) whose actions are determined according to the demand for implementation) is configured to generate the first group of control signals (i.e., the aforementioned SE_EN_ODD/PR_EN_ODD/OE_ODD) according to the system clock SCLK in the search and compare operation and thereby activate the aforementioned first group of circuits 522/532/542. After the first group of circuits 522/532/542 cooperates with the first group of CAM cells according to the first group of control signals, the second enablement signal generating circuit 1020 (e.g., a logic circuit implementing a FSM whose actions are determined according to the demand for implementation) is configured to generate the second group of control signals (i.e., the aforementioned SE_EN_EVEN/PR_EN_EVEN/OE_EVEN) and thereby activate the aforementioned second group of circuits 524/534/544. The second enablement signal generating circuit 1020 receives a feedback signal (FB) of the first group of circuits 522/532/542 and accordingly determines whether the first group of circuits 522/532/542 has already cooperated with the first group of CAM cells according to the first group of control signals. It is noted that the timing diagrams of the system clock SCLK, the first group of control signals, and the second group of control signals of FIG. 10 are illustrated with FIGS. 9b-9c.

Please refer to FIGS. 5-10. In an exemplary implementation, the time-division controller 510 controls a first peripheral circuit (e.g., the read/write auxiliary circuit 520) and a second peripheral circuit (e.g., the pre-charge circuit 530) of the multiple peripheral circuits, wherein the control over the first peripheral circuit and the control over the second peripheral circuit are synchronous, the first peripheral circuit is divided into N groups, the second peripheral circuit is divided into N groups, and the N is an integer greater than one. The time-division controller 510 outputs the first group of control signals at the aforementioned first time point and outputs the second group of control signals at the aforementioned second time point, and thereby controls the first peripheral circuit. The time-division controller 510 outputs a third group of control signals at the first time point and outputs a fourth group of control signals at the second time point, and thereby controls the second peripheral circuit. To be more specific, the second peripheral circuit includes a third group of circuits and a fourth group of circuits; the third group of circuits is configured to cooperate with the first group of CAM cells of the CAM cell array 50 according to the third group of control signals; and the fourth group of circuits is configured to cooperate with the second group of CAM cells of the CAM cell array 50 according to the fourth group of control signals.

Please refer to FIGS. 5-10. In an exemplary implementation, the time-division controller 510 controls a first peripheral circuit (e.g., the read/write auxiliary circuit 520 or the pre-charge circuit 530) and a second peripheral circuit (e.g., the output circuit 540) of the multiple peripheral circuits, wherein the control over the first peripheral circuit and the control over the second peripheral circuit are asynchronous, the first peripheral circuit is divided into N groups, the second peripheral circuit is divided into N groups, and the N is an integer greater than one. The time-division controller 510 outputs the first group of control signals at the aforementioned first time point and outputs the second group of control signals at the aforementioned second time point, and thereby controls the first peripheral circuit. The time-division controller 510 outputs a third group of control signals at a third time point and outputs a fourth group of control signals at a fourth time point, and thereby controls the second peripheral circuit. The third time point is earlier than the fourth time point but later than the first time point, and the fourth time point is later than the second time point. To be more specific, the second peripheral circuit includes a third group of circuits and a fourth group of circuits; the third group of circuits is configured to cooperate with the first group of CAM cells of the CAM cell array 50 according to the third group of control signals; and the fourth group of circuits is configured to cooperate with the second group of CAM cells of the CAM cell array 50 according to the fourth group of control signals.

Please refer to FIGS. 5-10. In an exemplary implementation, the time-division controller 510 controls a first peripheral circuit (e.g., the read/write auxiliary circuit 520) and a second peripheral circuit (e.g., the pre-charge circuit 530) of the multiple peripheral circuits, wherein the control over the first peripheral circuit and the control over the second peripheral circuit are asynchronous, the first peripheral circuit is divided into N group of circuits (e.g., two groups of circuits) and the second peripheral circuit is divided into M groups of circuits (e.g., four groups of circuits), wherein both the N and the M are integers greater than one, and the N is equal to or different from the M. The time-division controller 510 outputs the first group of control signals at the aforementioned first time point and outputs the second group of control signals at the aforementioned second time point, and thereby controls the first peripheral circuit; in addition, the time-division controller 510 outputs a third group of control signals at a third time point and outputs a fourth group of control signals at a fourth time point, and thereby controls the second peripheral circuit. The third time point is earlier than the fourth time point, and can be synchronous with the first time point; the fourth time point is later than the third time point, and can be equal to or earlier/later than the second time point. To be more specific, the second peripheral circuit includes a third group of circuits and a fourth group of circuits; the third group of circuits is configured to cooperate with the first group of CAM cells of the CAM cell array 50 according to the third group of control signals; and the fourth group of circuits is configured to cooperate with the second group of CAM cells of the CAM cell array 50 according to the fourth group of control signals. When the N is different from the M, a number of CAM cells (hereinafter referred to as "the number Y") of the third/fourth group of CAM cells is different from a number of CAM cells (hereinafter referred to as "the number X") of the first/second group of CAM cells; for example, if the M is equal to the N multiplied by two, the Y is equal to the X divided by two (i.e., if M=2N, Y=X/2).

Please refer to FIGS. 5-10. Any of the multiple peripheral circuits can be divided into two or more groups of circuits (e.g., three groups of circuits). In an exemplary implementation, the time-division controller 510 controls a certain peripheral circuit (e.g., the read/write auxiliary circuit 520, the pre-charge circuit 530, or the output circuit 540), wherein the certain peripheral circuit is divided into N group of circuits including a first group of circuits, a second group of circuits, and a third group of circuits, and the N is an integer greater than two. The time-division controller 510 outputs the first group of control signals at the aforementioned first time point and outputs the second group of control signals at the aforementioned second time point, and thereby controls the first group of circuits and the second group of circuits respectively. In addition, the time-division controller 510 outputs a third group of control signals at a third time point and thereby controls the third group of circuits, wherein the third time point is later than the second time point. To be more specific, the first group of circuits, the second group of circuits, and the third group of circuits of the certain peripheral circuit are configured to control a first group of CAM cells, a second group of CAM cells, and a third group of CAM cells of the CAM cell array 50 according to the first group of control signal, the second group of control signals, and the third group of control signals respectively. The three groups of CAM cells do not overlap, which means that any CAM cell in one of the three groups of CAM cells is different from any CAM cell in the other two groups of CAM cells.

It should be noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible.

To sum up, the time-division memory control device of the present disclosure controls a CAM in a time-division manner, and thereby reduces a peak current and solves the EM/IR problems.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A time-division memory control device configured to control a content addressable memory (CAM), the time-division memory control device comprising:
   a time-division controller configured to generate multiple groups of control signals according to a system clock in a search and compare operation, wherein the multiple groups of control signals include a first group of control signals and a second group of control signals, the time-division controller outputs the first group of control signals at a first time point and outputs the second group of control signals at a second time point later than the first time point; and
   a plurality of peripheral circuits configured to cooperate with a CAM cell array of the CAM, wherein the plurality of peripheral circuits include a first peripheral circuit including:
   a first group of circuits configured to cooperate with a first group of CAM cells of the CAM cell array according to the first group of control signals; and
   a second group of circuits configured to cooperate with a second group of CAM cells of the CAM cell array according to the second group of control signals, wherein the second group of CAM cells does not include any CAM cell of the first group of CAM cells.

2. The time-division memory control device of claim 1, wherein the plurality of peripheral circuits include a read/write auxiliary circuit, a pre-charge circuit, and an output circuit; the output circuit includes at least one of a sense amplifier circuit and a register circuit; and the first peripheral circuit is one of the read/write auxiliary circuit, the pre-charge circuit, and the output circuit.

3. The time-division memory control device of claim 1, wherein the time-division controller includes:
   an enablement signal generating circuit configured to generate the first group of control signals and the second group of control signals according to the system clock in the search and compare operation, in which the first group of control signals and the second group of control signals are used for enabling the first group of circuits and the second group of circuits respectively; and
   a delay circuit configured to delay the second group of control signals and thereby allow the time-division controller to output the second group of control signals at the second time point later than the first time point.

4. The time-division memory control device of claim 3, wherein the first peripheral circuit is one of the following circuits: a read/write auxiliary circuit; and a pre-charge circuit.

5. The time-division memory control device of claim 4, wherein the first time point is synchronous with a trigger time point of the system clock.

6. The time-division memory control device of claim 3, wherein the first peripheral circuit is an output circuit, and the output circuit includes at least one of a sense amplifier circuit and a register circuit.

7. The time-division memory control device of claim 6, wherein the first time point is later than a trigger time point of the system clock.

8. The time-division memory control device of claim 1, wherein the time-division controller includes:
   a first enablement signal generating circuit configured to generate the first group of control signals according to the system clock in the search and compare operation; and
   a second enablement signal generating circuit configured to generate the second group of control signals after the first group of circuits controls the first group of CAM cells according to the first group of control signals.

9. The time-division memory control device of claim 8, wherein the second enablement signal generating circuit receives a feedback signal of the first group of circuits and accordingly determines whether the first group of circuits has already controlled the first group of CAM cells.

10. The time-division memory control device of claim 8, wherein the first peripheral circuit is one of the following circuits: a read/write auxiliary circuit; and a pre-charge circuit.

11. The time-division memory control device of claim 10, wherein the first time point is synchronous with a trigger time point of the system clock.

12. The time-division memory control device of claim 8, wherein the first peripheral circuit is an output circuit, and the output circuit includes at least one of a sense amplifier circuit and a register circuit.

13. The time-division memory control device of claim 12, wherein the first time point is later than a trigger time point of the system clock.

14. The time-division memory control device of claim 1, wherein the multiple groups of control signals further include a third group of control signals and a fourth group of control signals; the time-division controller outputs the third group of control signals at the first time point and outputs the fourth group of control signals at the second time point; and the plurality of peripheral circuits further include a second peripheral circuit including:
   a third group of circuits configured to cooperate with the first group of CAM cells of the CAM cell array according to the third group of control signals; and
   a fourth group of circuits configured to cooperate with the second group of CAM cells of the CAM cell array according to the fourth group of control signals.

15. The time-division memory control device of claim 14, wherein the first peripheral circuit and the second peripheral circuit are a read/write auxiliary circuit and a pre-charge circuit respectively.

16. The time-division memory control device of claim 1, wherein the multiple groups of control signals further include a third group of control signals and a fourth group of control signals; the time-division controller outputs the third group of control signals at a third time point and outputs the fourth group of control signals at a fourth time point; the fourth time point is later than each of the second time point and the third time point; the third time point is later than the first time point; and the plurality of peripheral circuits further include a second peripheral circuit including:
   a third group of circuits configured to cooperate with the first group of CAM cells of the CAM cell array according to the third group of control signals; and
   a fourth group of circuits configured to cooperate with the second group of CAM cells of the CAM cell array according to the fourth group of control signals.

17. The time-division memory control device of claim 16, wherein the first peripheral circuit is one of a read/write auxiliary circuit and a pre-charge circuit; the second peripheral circuit is an output circuit; and the output circuit includes at least one of a sense amplifier circuit and a register circuit.

18. The time-division memory control device of claim 1, wherein the multiple groups of control signals further include a third group of control signals and a fourth group of control signals; the time-division controller outputs the third group of control signals at a third time point and outputs the fourth group of control signals at a fourth time point later than the third time point; and the plurality of peripheral circuits further include a second peripheral circuit including:
- a third group of circuits configured to control a third group of CAM cells of the CAM cell array according to the third group of control signals; and
- a fourth group of circuits configured to control a fourth group of CAM cells of the CAM cell array according to the fourth group of control signals.

19. The time-division memory control device of claim 18, wherein a number of CAM cells of the third group of CAM cells is different from a number of CAM cells of the first group of CAM cells; and a number of CAM cells of the fourth group of CAM cells is different from a number of CAM cells of the second group of CAM cells.

20. The time-division memory control device of claim 1, wherein the multiple groups of control signals further include a third group of control signals; the time-division controller outputs the third group of control signals at a third time point later than the second time point; and the first peripheral circuit further includes:
- a third group of circuits configured to control a third group of CAM cells of the CAM cell array according to the third group of control signals, in which the third group of CAM cells does not include any CAM cell of the first group of CAM cells and the second group of CAM cells.

* * * * *